(12) United States Patent
Kanasugi

(10) Patent No.: US 8,006,146 B2
(45) Date of Patent: Aug. 23, 2011

(54) TEST APPARATUS AND TEST METHOD FOR TESTING A PLURALITY OF DEVICES UNDER TEST

(75) Inventor: Hiroshi Kanasugi, Kawasaki (JP)

(73) Assignee: Advantest Corporation, Tokyo (JP)

( * ) Notice: Subject to any disclaimer, the term of this patent is extended or adjusted under 35 U.S.C. 154(b) by 192 days.

(21) Appl. No.: 12/366,648

(22) Filed: Feb. 6, 2009

(65) Prior Publication Data

US 2010/0042878 A1     Feb. 18, 2010

Related U.S. Application Data

(63) Continuation of application No. PCT/JP2007/065449, filed on Aug. 7, 2007.

(30) Foreign Application Priority Data

Aug. 14, 2006   (JP) ................................ 2006-221186

(51) Int. Cl.
    G11C 29/00        (2006.01)
(52) U.S. Cl. ....................................... 714/719
(58) Field of Classification Search ................ 714/718, 714/719, 723
    See application file for complete search history.

(56) References Cited

U.S. PATENT DOCUMENTS

| | | | |
|---|---|---|---|
| 5,412,662 A * | 5/1995 | Honma et al. ................. | 714/718 |
| 5,539,699 A * | 7/1996 | Sato et al. ..................... | 365/201 |
| 6,374,378 B1 | 4/2002 | Takano et al. | |
| 6,452,411 B1 * | 9/2002 | Miller et al. ............. | 324/754.07 |
| 6,690,189 B2 * | 2/2004 | Mori et al. ..................... | 324/765 |
| 6,754,868 B2 * | 6/2004 | Bristow et al. ................. | 714/744 |
| 6,768,349 B2 * | 7/2004 | Nakagawa ..................... | 327/100 |
| 6,885,961 B2 * | 4/2005 | Breger et al. ................. | 702/117 |
| 7,003,697 B2 * | 2/2006 | Magliocco ....................... | 714/25 |
| 7,404,122 B2 * | 7/2008 | Krech ............................ | 714/724 |
| 7,421,632 B2 * | 9/2008 | Jordan et al. .................. | 714/724 |
| 7,472,326 B2 * | 12/2008 | Holmes .......................... | 714/738 |
| 7,559,003 B2 * | 7/2009 | Takahashi ...................... | 714/742 |
| 7,743,304 B2 * | 6/2010 | Volkerink et al. ............. | 714/738 |
| 2004/0148119 A1 | 7/2004 | Baba | |
| 2006/0023526 A1 | 2/2006 | Takahashi | |

FOREIGN PATENT DOCUMENTS

| | | |
|---|---|---|
| JP | 60-192274 | 9/1985 |
| JP | 2000-100196 | 4/2000 |
| JP | 2000-137996 | 5/2000 |

(Continued)

OTHER PUBLICATIONS

"Office Action of Korea Counterpart Application", issued on Oct. 25, 2010, p. 1-p. 5.

(Continued)

Primary Examiner — James C Kerveros
(74) Attorney, Agent, or Firm — Chen Yoshimura LLP

(57) ABSTRACT

Provided is a test apparatus for testing a plurality of devices under test, the test apparatus including: a data supplying section that concurrently supplies test data to the plurality of devices under test; a writing control section that controls the test data to be concurrently written to the plurality of devices under test; and a reading control section that successively reads the test data from each of the plurality of devices under test. The plurality of devices under test may be a plurality of memories under test.

2 Claims, 7 Drawing Sheets

FOREIGN PATENT DOCUMENTS

| | | |
|---|---|---|
| JP | 2006048767 | 2/2006 |
| JP | 2007-157303 | 6/2007 |
| WO | 02/097822 | 12/2002 |

OTHER PUBLICATIONS

"Partial Translation of Office Action of Korea Counterpart Application", issued on Oct. 25, 2010, p. 1-p. 4.

Taiwanese Office Action in a counterpart application No. 096129960, dated Jan. 21, 2011, citing U.S. Patent No. 1, U.S. Patent Application Publication Nos. 1-2, and Foreign Patent document Nos. JP2000-137996 and JP60-192274.

* cited by examiner

TEST APPARATUS AND TEST METHOD FOR TESTING A PLURALITY OF DEVICES UNDER TEST

CROSS REFERENCE TO RELATED APPLICATION

This is a continuation application of PCT/JP2007/065449 filed on Aug. 7, 2007 which claims priority from a Japanese Patent Application No. 2006-221186 filed on Aug. 14, 2006, the contents of which are incorporated herein by reference.

BACKGROUND

1. Technical Field

The present invention relates to a test apparatus and a test method for a memory. In particular, the present invention relates to a test apparatus and a test method for concurrently testing a plurality of memories under test.

2. Related Art

Conventional semiconductor memory test apparatuses are designed to concurrently test a plurality of memories under test, for the purpose of enhancing the test efficiency. Specifically, a conventional semiconductor memory test apparatus writes test data to each of the plurality of memories under test, and causes each of the memories under test to output the test data having been written therein. The semiconductor memory test apparatus then determines whether each outputted test data matches expected value data, in order to determine the acceptability of each memory under test.

When the memories under test are flash memories, the time required for testing the memories under test is not constant due to occurrence of writing/reading errors. In the conventional test apparatuses, various functions are provided to enhance the test efficiency, such as controlling memories under test having determined to fail a test at some stage of the test will stop being subjected to the further test stages, to make sure these failure memories under test will not obstruct the test of the other memories under test.

No prior art documents are recognized to date.

Some conventional test apparatuses occasionally own, for each of a plurality of memories under test, a circuit for controlling input/output (hereinafter referred to as "input/output circuit") of test data to/from the memory under test. Then, the test apparatus can concurrently read test data from each of the memories under test, and determine the acceptability of the memories under test independently from each other. However, in such a configuration, the number of memories under test that can be tested at the same time is limited by the number of input/output circuits. A greater number of input/output circuits will be required if a greater number of memories under test are desired to be tested concurrently, thereby leading to increase in the dimension of the test apparatus.

In some tests, test data to be written can be the same for the plurality of memories under test. In such a test, test data outputted from a single input/output circuit is simply supplied to the plurality of memories under test that are bus connected to each other. This does not increase the number of required input/output circuits even if there is increase in number of memories under test, and can prevent increase in the dimension of the test apparatus. However, this configuration requires determining which memory under test has outputted which piece of test data. Conventional test apparatuses have coped with this problem by collecting and analyzing all the data after a test has ended, to determine which test data is read from which memory under test. This step can be time-consuming, to degrade the test efficiency.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus for testing a plurality of devices under test includes: a data supplying section that concurrently supplies test data to the plurality of devices under test; a writing control section that controls the test data to be concurrently written to the plurality of devices under test; and a reading control section that successively reads the test data from each of the plurality of devices under test.

According to the second aspect related to the innovations herein, one exemplary test apparatus for testing a plurality of memories under test is such that each of the plurality of memories under test reads or writes data corresponding to one memory block, in response to a read command or a write command, the test apparatus includes: a failure block storage that stores, for each of the plurality of memories under test, acceptability information respectively of a plurality of memory blocks included in the memory under test; a data input/output section that is bus connected to data input/output terminals respectively of the plurality of memories under test, and communicates data with the respective data input/output terminals, a data supplying section that concurrently supplies test data to the plurality of memories under test via the data input/output section; and a writing control section that concurrently writes the test data to the plurality of memories under test, by concurrently supplying write enable signals to the plurality of memories under test in synchronization with the supply of the test data, and the writing control section, a) when concurrently writing the test data to the plurality of memories under test, reads acceptability information of a memory block corresponding to a writing address, from each of the plurality of failure block storages, and b) when the acceptability information read from the failure block storage indicates that the memory block corresponding to the writing address is a failure, masks the write enable signal to a corresponding memory under test, thereby prohibiting writing to the memory under test According to the third aspect related to the innovations herein, one exemplary test method of testing a plurality of devices under test includes: concurrently supplying test data to data input/output terminals respectively of the plurality of devices under test; concurrently writing the test data to the plurality of devices under test; and successively reading the test data from each of the plurality of devices under test.

According to the fourth aspect related to the innovations herein, one exemplary test method of testing a plurality of memories under test that perform reading or writing of data corresponding to one memory block in response to a read command or a write command includes: for each of the plurality of memories under test, storing acceptability information respectively of a plurality of memory blocks included in the memory under test; reading acceptability information of a memory block corresponding to a writing address; when the read acceptability information indicates that the writing address is a failure, prohibiting writing to a corresponding memory under test; and by concurrently supplying test data to the plurality of memories under test, concurrently writing the test data to a part of the plurality of memories under test to which writing is not prohibited.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
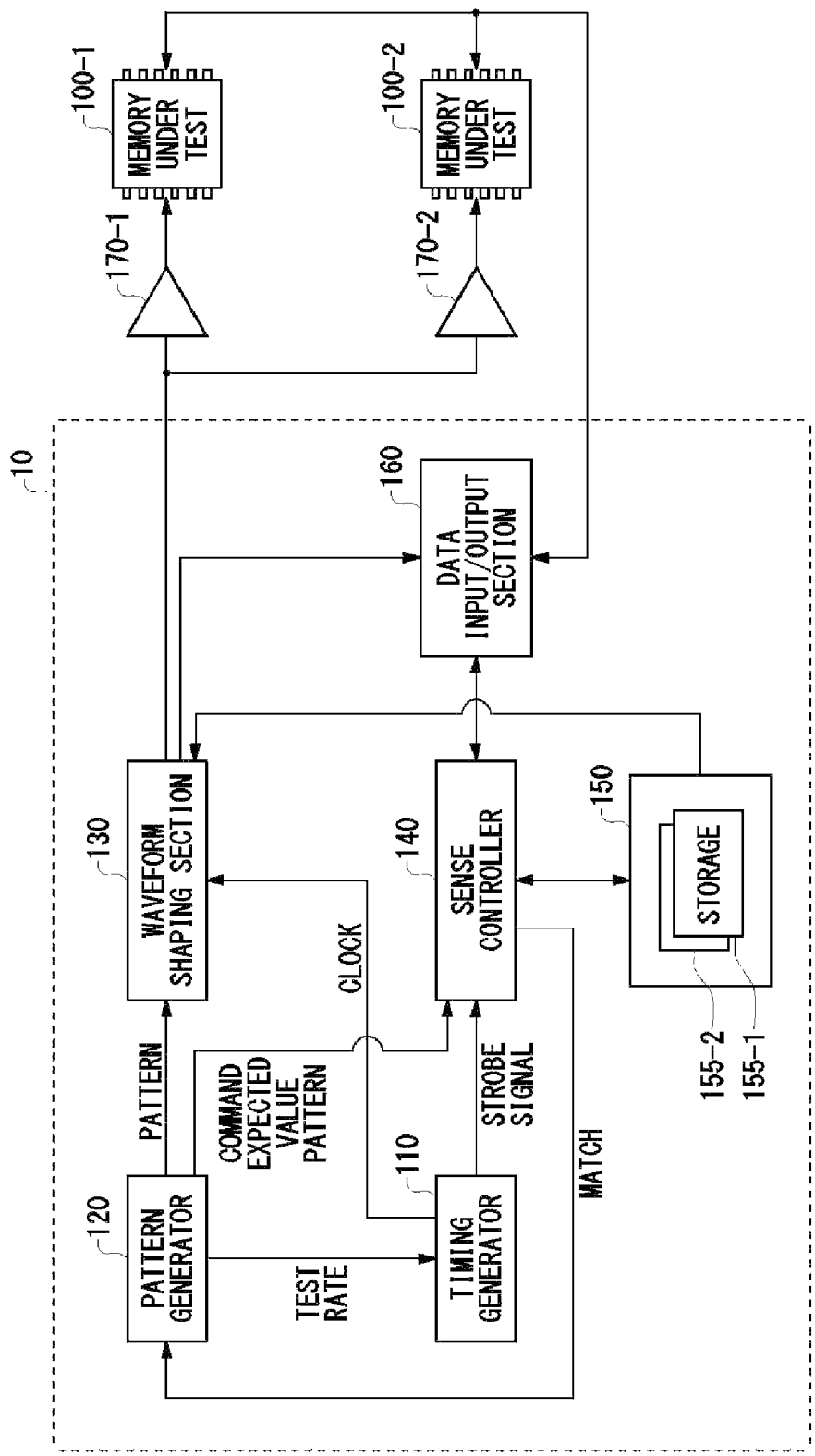
FIG. 1 shows peripheral connection circuits of memories under test 100-1-100-2.

FIG. 1 shows the entire configuration of a test apparatus 10 according to the present embodiment. The test apparatus 10 supplies test data from a single data input/output section 160 to memories under test 100-1-100-2 bus connected with the input/output section 160, for testing the memories under test 100-1-100-2 concurrently. Each of the memories under test 100-1-100-2 may be a semiconductor memory, a SoC (system on chip) with a memory function, or the like. One example of the memories under test 100-1-100-2 is a flash memory. When a block in the flash memory causes an error, writing to the block takes more time than for normal blocks, which may result in abnormal ending.

So as to determine that there is a failure in a block, it is required to confirm that the writing state has been continuing for an unreasonably long time after writing data, which cannot happen in normal writing. Therefore, testing of a memory under test having caused an error takes a longer time than for testing a normal memory under test, which results in varying time for testing the memories under test. This may lead to inefficiency in cases such as the present embodiment where test data is concurrently supplied to a plurality of memories under test via a bus connection, because the entire test ends after ending testing the memories under test having caused errors, which is typically after ending testing the normal memories under test.

Moreover, since the data input/output section 160 is bus connected to the memories under test 100-1-100-2, it is necessary to distinguish which memory has outputted particular test data inputted to the data input/output section 160. The test apparatus 10 according to the present embodiment aims to resolve the problems caused due to the concurrent testing, and to efficiently test a plurality of memories under test.

The test apparatus 10 includes a timing generator 110, a pattern generator 120, a waveform shaping section 130, a sense controller 140, a failure storage 150, and a data input/output section 160. The timing generator 110 generates a periodic clock representing one test cycle, based on a test rate signal outputted from the pattern generator 120, and supplies the generated periodic clock to the waveform shaping section 130. The timing generator 110 also outputs a strobe signal to the sense controller 140. The strobe signal controls a timing at which an output pattern from the memories under test 100-1-100-2 is compared to an expected value pattern. The pattern generator 120 generates a test pattern to be supplied to the memories under test 100-1-100-2, and supplies the generated test pattern to the waveform shaping section 130. The pattern generator 120 also outputs a command for writing test data to the memories under test 100-1-100-2, to the sense controller 140, as well as outputting a command for reading test data from the memories under test 100-1-100-2, to the sense controller 140.

The waveform shaping section 130 shapes the waveform of the test pattern based on the received periodic clock and the received test pattern, and outputs the shaped waveform to the data input/output section 160 and to the drivers 170-1-170-2. The sense controller 140 compares the test data acquired from the data input/output section 160, with the expected value pattern acquired from the pattern generator 120. When a piece of test data does not match its expected value, the sense controller 140 detects writing failure of the memory under test having outputted the piece of test data, and writes the detection result to the failure storage 150. The failure storage 150 stores, for each of the plurality of blocks constituting the memories under test 100-1-100-2, information about whether the block is a failure that includes more than a preset number of data errors.

The data input/output section 160 is bus connected to the data input/output terminals of the memories under test 100-1-100-2, and communicates data with the data input/output terminals. The drivers 170-1-170-2 are provided for the memories under test 100-1-100-2 respectively. Each of the drivers 170-1-170-2 outputs either a write enable signal or a read enable signal to a corresponding memory under test, to perform reading or writing to the memory under test 100-1-100-2.

An input signal outputted from the waveform shaping section 130 is amplified by a driver within the data input/output section 160 based on the reference voltage (VI), and then inputted to the memories under test 100-1-100-2. The output from the memories under test 100-1-100-2 is compared to the reference voltage (VO) by a comparator within the data input/output section 160, and is compared by the sense controller 140 to the expected value pattern outputted from the pattern generator 120. When the result of the comparisons indicates detection of a failure in the memory under test, acceptability information indicating such is recorded to the failure storage 150.

The failure storage 150 includes storages 155-1-155-2, each of which stores the comparison result between the read test data and the expected value data for a corresponding one of the memories under test 100-1-100-2. The storages 155-1-155-2 may be respective data regions corresponding to different addresses from each other within a single failure storage 150. Each of the storages 155-1-155-2 stores acceptability information of a corresponding memory under test. For example, each of the storages 155-1-155-2 may store acceptability information for each storage cell of a corresponding memory under test, or respective pieces of acceptability information of a plurality of memory blocks within the corresponding memory under test. When detecting a failure in a block of a memory under test based on the acceptability information stored in the failure storage 150, the sense controller 140 masks testing of the memory under test for which a failure block has been detected, thereby testing only the other memory under test.

Figure 2:
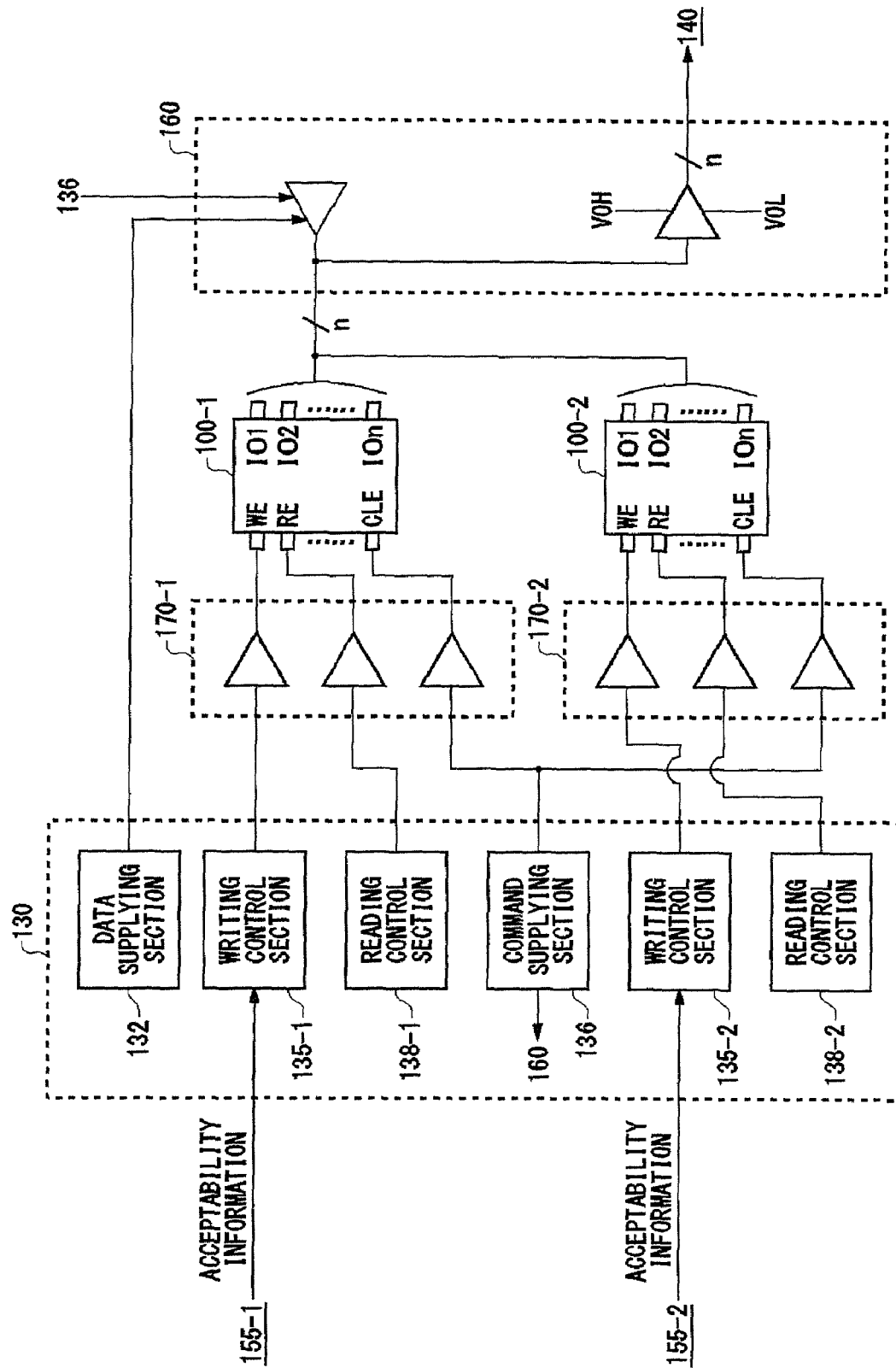
FIG. 2 shows an exemplary configuration of a comparator 24, a first adjusting section 32, and a second adjusting section 34, according to the present embodiment.

FIG. 2 shows peripheral connection circuits of the memories under test 100-1-100-2. The waveform shaping section 130 includes a data supplying section 132, writing control sections 135-1-135-2, a command supplying section 136, and reading control sections 138-1-138-2. The data supplying section 132 concurrently supplies test data to the memories under test 100-1-100-2 via the data input/output section 160. Specifically, the data supplying section 132 supplies only a single set of test data to the memories under test 100-1-100-2, and the data input/output section 160 outputs the received test data to a signal line that is bus connected to both of the memories under test 100-1-100-2.

The writing control sections 135-1-135-2 cooperate with each other to function as a writing control section in the present invention. Specifically, the writing control section 135-1, corresponding to the memory under test 100-1, supplies a write enable signal to a memory under test 100-1 in synchronization with the supply of test data, and writes the test data to the memory under test 100-1. The writing control section 135-2, corresponding to the memory under test 100-2, supplies a write enable signal to a memory under test 100-2 in synchronization with the supply of test data and in concurrence with the writing control section 135-1. As a result, the writing control sections 135-1-153-2 are able to concurrently write the test data to the memories under test 100-1-100-2.

In this case, the writing control sections 135-1-135-2 read acceptability information of a memory block corresponding to a writing address from each of the storages 155-1-155-2. When acceptability information indicating that a memory block corresponding to the writing address is a failure is read from the writing control sections 135-1-135-2, the writing control sections 135-1-135-2 respectively mask a write enable signal with respect to the corresponding memory under test, and prohibit writing to the corresponding memory under test. Accordingly, a memory block for which a failure has been detected is not subjected to further writing, thereby shortening the time required for the entire test. The command supplying section 136 concurrently supplies read commands to the memories under test 100-1-100-2, for instructing reading of the test data written to the memories under test 100-1-100-2 respectively. The read command is realized by a pulse input to the CLE terminal and a data input to the input/output terminal via the data input/output section 160, for example.

The reading control sections 138-1-138-2 cooperate with each other to function as a reading control section according to the present invention. Specifically, the reading control section 138-1, corresponding to the memory under test 100-1, successively supplies a read enable signal to the memory under test 100-1, and successively reads test data from each of the memories under test 100-1-100-2 via the data input/output section 160. The reading control section 138-2, corresponding to the memory under test 100-2, successively supplies a read enable signal to the memory under test 100-2, to successively read test data from the memory under test 100-2 via the data input/output section 160. For example, the reading by the reading control section 138-1 and the reading by the reading control section 138-2 are performed alternately for each memory cell or for each data unit. When each of the memories under test 100-1-100-2 outputs, for a single read command, a plurality of pieces of test data corresponding to one memory block, the test data reading is performed for each memory block. For example, the reading control sections 138-1-138-2 concurrently supply read commands to the respective memories under test 100-1-100-2, sequentially supply read enable signals to the respective memories under test 100-1-100-2, and concurrently read test data corresponding to one memory block from the memories under test 100-1-100-2.

The data input/output section 160 is bus connected to the data input/output terminals of the memory under test 100-1 and the memory under test 100-2. The data input/output section 160 outputs, to the data input/output terminals, the test data received from the data supplying section 132 or the data received from the command supplying section 136. In addition, the data input/output section 160 outputs, to the sense controller 140, the test data outputted from the memories under test 100-1-100-2.

The drivers 170-1-170-2 correspond to the memories under test 100-1-100-2 respectively. The driver 170-1 adjusts a write enable signal outputted from the writing control section 135-1 to a preset voltage level based on the reference voltage (VI) of an input signal, and applies the adjusted write enable signal to a terminal (WE) of the memory under test 100-1 provided to receive a write enable signal. The driver 170-1 adjusts a read enable signal outputted from the reading control section 138-1 to a preset voltage level based on the reference voltage (VI), and applies the adjusted read enable signal to a terminal (RE) of the memory under test 100-1 provided to receive a read enable signal. In addition, the driver 170-1 adjusts a command signal outputted from the command supplying section 136 to a preset voltage level based on the reference voltage (VI), and applies the adjusted command signal to a CLE terminal of the memory under test 100-1.

Likewise, the driver 170-2 adjusts a write enable signal outputted from the writing control section 135-2 to a preset voltage level based on the reference voltage (VI), and applies the adjusted write enable signal to a terminal (WE) of the memory under test 100-2. In addition, the driver 170-2 adjusts a read enable signal outputted from the reading control section 138-2 to a preset voltage level based on the reference voltage (VI), and applies the adjusted read enable signal to a terminal (RE) of the memory under test 100-2. Moreover, the driver 170-2 adjusts a command signal outputted from the command supplying section 136 to a preset voltage value based on the reference voltage (VI), and applies the adjusted command signal to a CLE terminal of the memory under test 100-2.

Figure 3:
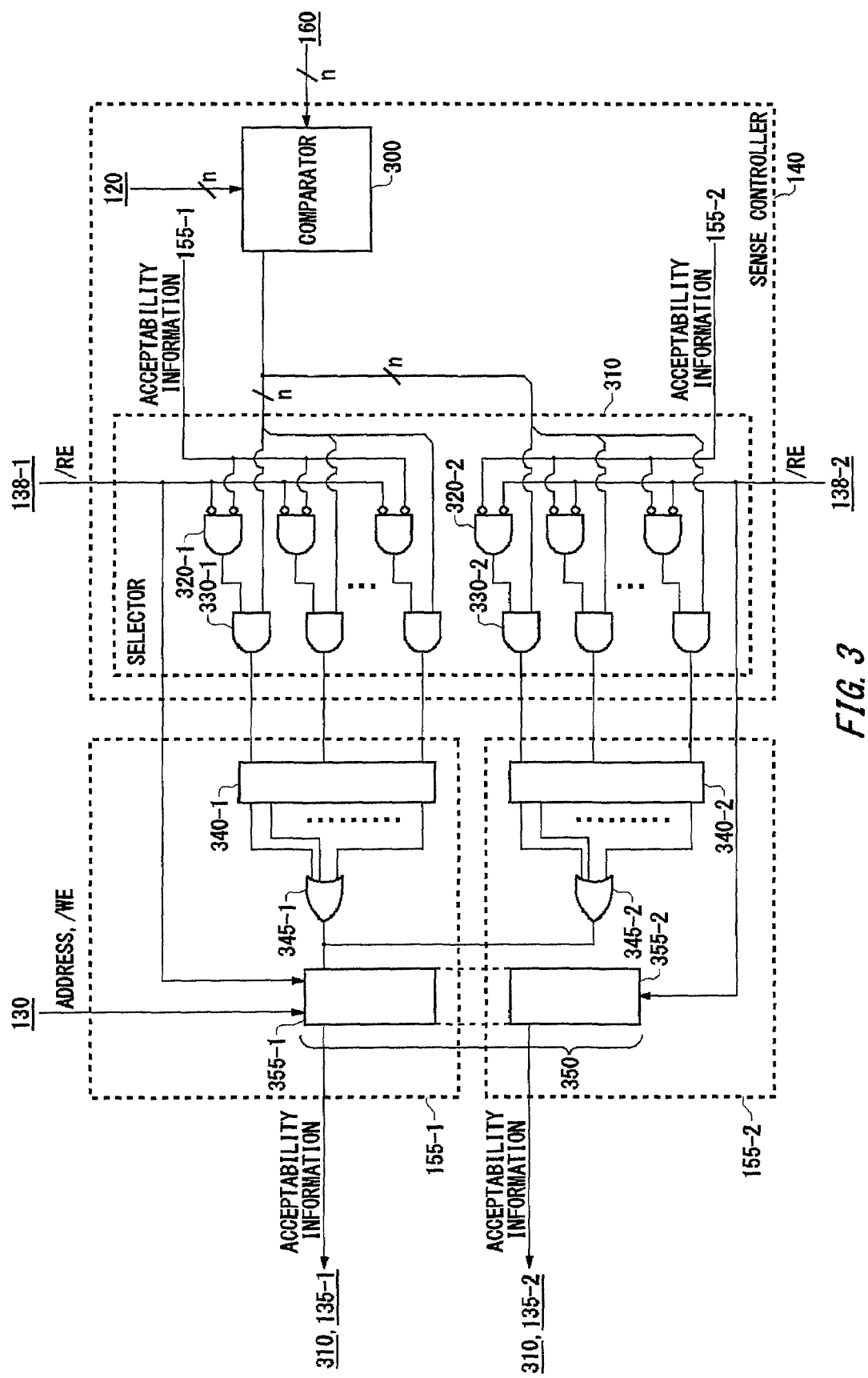
FIG. 3 shows an exemplary functional configuration of a sense controller 140 and a failure storage 150.

FIG. 3 shows an exemplary functional configuration of the sense controller 140 and the failure storage 150. The sense controller 140 includes a comparator 300 and a selector 310. The comparator 300 acquires test data successively read from the memories under test 100-1-100-2 via the data input/output terminals IO1-IOn, respectively. In addition, the comparator 300 acquires expected value data respectively corresponding to the acquired test data, from the pattern generator 120. The comparator 300 compares the acquired test data to the expected value data, and outputs the comparison result to the selector 310, respectively.

The selector 310 selects one of storages 155-1-155-2 that corresponds to a memory under test to which the reading control sections 138-1-138-2 have supplied the read enable signal, based on the read enable signal, and writes the comparison result outputted from the comparator 300, to the selected storage. In addition, the selector 310 does not write, to the failure storage 150, a comparison result outputted from the comparator 300 for a block that has caused a failure. Specifically, the selector 310 includes an AND gate 320-1 and an AND gate 330-1 provided for respective input/output terminals of the memory under test 100-1. For a block to which writing should be performed, the AND gate 320-1 outputs AND between negation of a read enable signal (which takes on a logic value 0 when enabled) and negation of the acceptability information of the block (which takes on a logic value 1 when in failure). That is, a logic value 1 is outputted when a read enable signal is outputted and the corresponding block is not a failure block. The AND gate 330-1 outputs, to the storage 155-1, AND between a signal outputted from the AND gate 320-1 and the comparison result acquired from the comparator 300.

Likewise, the selector 310 includes an AND gate 320-2 and an AND gate 330-2 that are provided for respective input/output terminals of the memory under test 100-2. For a block to which writing should be performed, the AND gate 320-2 outputs AND between negation of a read enable signal (which takes on a logic value 0 when enabled) and negation of the acceptability information of the block (which takes on a logic value 1 when in failure). That is, a logic value 1 is outputted when a read enable signal is outputted and the corresponding block is not a failure block. The AND gate 330-2 outputs, to the storage 155-2, AND between a signal outputted from the AND gate 320-2 and the comparison result acquired from the comparator 300.

The storage 155-1 includes a failure cell storage 340-1, an OR gate 345-1, and a failure block storage 355-1. The failure cell storage 340-1 stores failures caused in the memory under test 100-1 for each bit. The OR gate 345-1 calculates OR of the acceptability information stored in the failure cell storage 340-1, generates pieces of acceptability information respectively for the plurality of memory blocks included in the memory under test 100-1, and outputs the generated pieces of acceptability information to the failure block storage 355-1 and the selector 310. The failure block storage 355-1 stores the pieces of acceptability information respectively for the plurality of memory blocks included in the memory under test 100-1.

Likewise, the storage 155-2 includes a failure cell storage 340-2, an OR gate 345-2, and a failure block storage 355-2. The failure cell storage 340-2 stores failures caused in the memory under test 100-2 for each bit. The OR gate 345-2 calculates OR of the acceptability information stored in the failure cell storage 340-2, generates pieces of acceptability information respectively for the plurality of memory blocks included in the memory under test 100-2, and outputs the generated pieces of acceptability information to the failure block storage 355-2 and the selector 310. The failure block storage 355-2 stores the pieces of acceptability information respectively for the plurality of memory blocks included in the memory under test 100-2.

As shown in the drawing, the failure block storages 355-1-355-2 may be respective data regions in a single failure block memory 350, which correspond to different addresses from each other. In response to receiving a memory address, the failure block memory 350 performs reading or writing of acceptability information to the memory address. For example, when writing acceptability information, the memory address is defined based on the address in the memory under test 100-1 outputted from the data supplying section 132 and the read enable signal. That is, based on to which memory under test the reading control sections 138-1-138-2 have supplied the read enable signal, the selector 310 changes the address supplied from the data supplying section 132 and supplies the changed address to the memory under test 100-1, thereby writing the comparison result to the data region corresponding to the memory under test.

When reading acceptability information, the memory address is defined based on the address in the memory under test 100-1 outputted from the data supplying section 132 and the write enable signal. That is, the writing control sections 135-1-135-2 supply write enable signals respectively for the memories under test 100-1-100-2, sequentially supply, to the failure block memory 350, memory addresses of the adequate data regions to which acceptability information has been stored, and sequentially read the acceptability information.

It is preferable that the failure block storage 355-1 be capable of storing acceptability information of all the blocks of the memory under test 100-1, and the failure block storage 355-2 be capable of storing acceptability information of all the blocks of the memory under test 100-2. According to this configuration, even when a test is discretely performed to the entire address space of the memory under test 100, the test can be performed efficiently by excluding failure blocks. Alternatively, the failure block storage 355-1 may store acceptability information of only a part of the blocks (e.g., half of the blocks) of the memory under test 100-1. In this case, the writing control section 1355-1 may change the address outputted to the failure block storages 355-1-355-2, to switch between storing failure information regarding the block of the leading address of the memory under test 100-1 and storing failure information regarding the block of the trailer address of the memory under test 100-1. According to the stated configuration, the required capacity of the failure block storages 355-1-355-2 can be reduced thereby reducing the dimension of the test apparatus 10.

Figure 4:
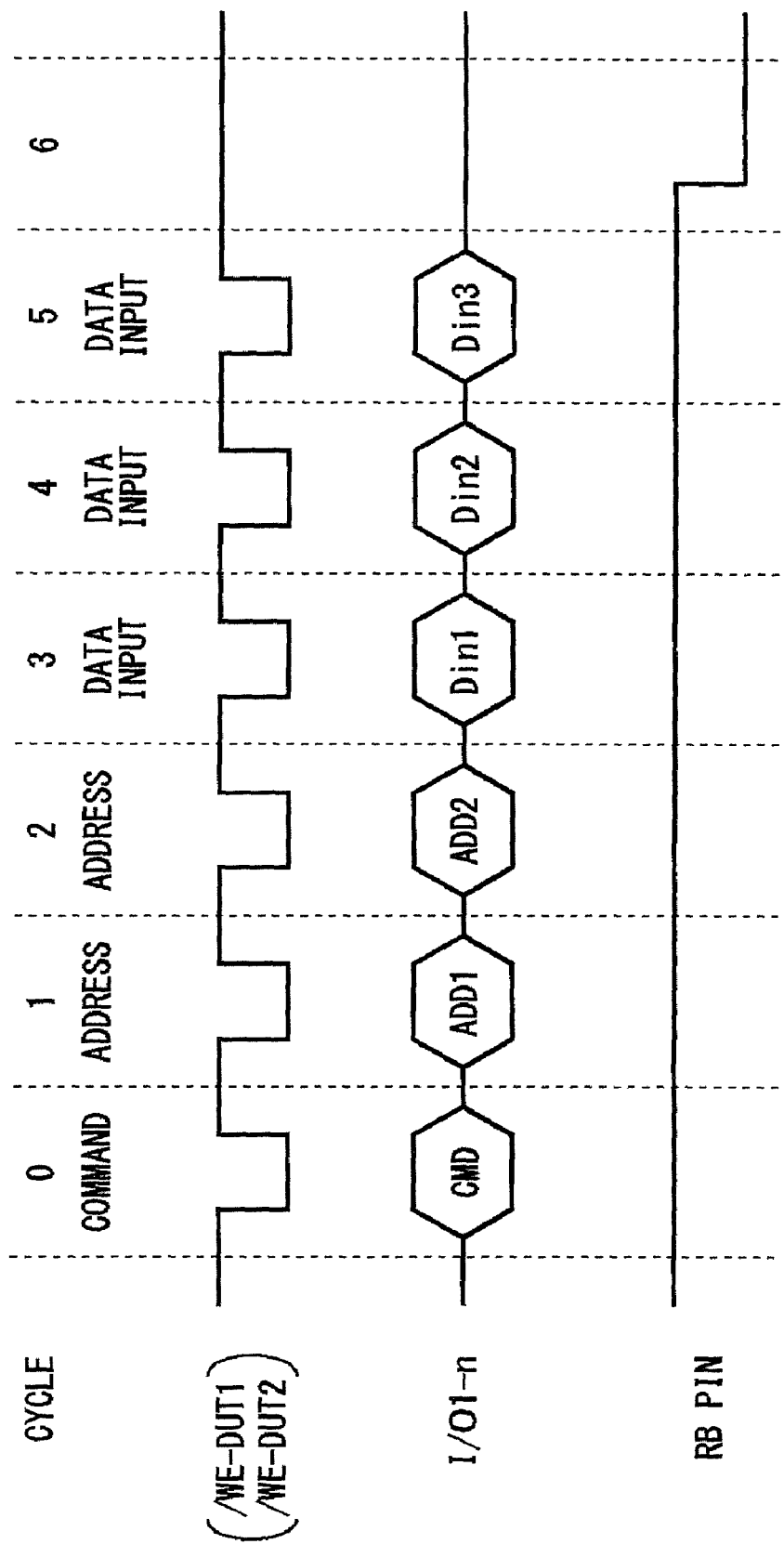
FIG. 4 is a timing chart of a process to write test data to memories under test 100-1-100-2.

FIG. 4 is a timing chart of a process to write test data to the memories under test 100-1-100-2. At Cycle 0, the command supplying section 136 supplies a write command to the memories under test 100-1-100-2, so as to write test data to the memories under test 100-1-100-2. At Cycles 1 and 2, the data supplying section 132 supplies an address to which the data is written, to the data input/output terminals of the memories under test 100-1-100-2, and at Cycles 3-5, the data supplying section 132 supplies data to be written, to the data input/output terminals of the memories under test 100-1-100-2. Concurrently with the above processes, the writing control sections 135-1-135-2 supply a write enable signal to the memories under test 100-1-100-2 at each cycle. After the completion of the above processes, the logic value of the signal of the RB pin changes to 0 at Cycle 6. The writing process of the memory under test continues until the logic value returns to 1. In some cases, the logic value of the signal does not return to 1, for example when the block has caused a failure, and this constitutes one factor of differing the test time for each memory under test.

Figure 5:
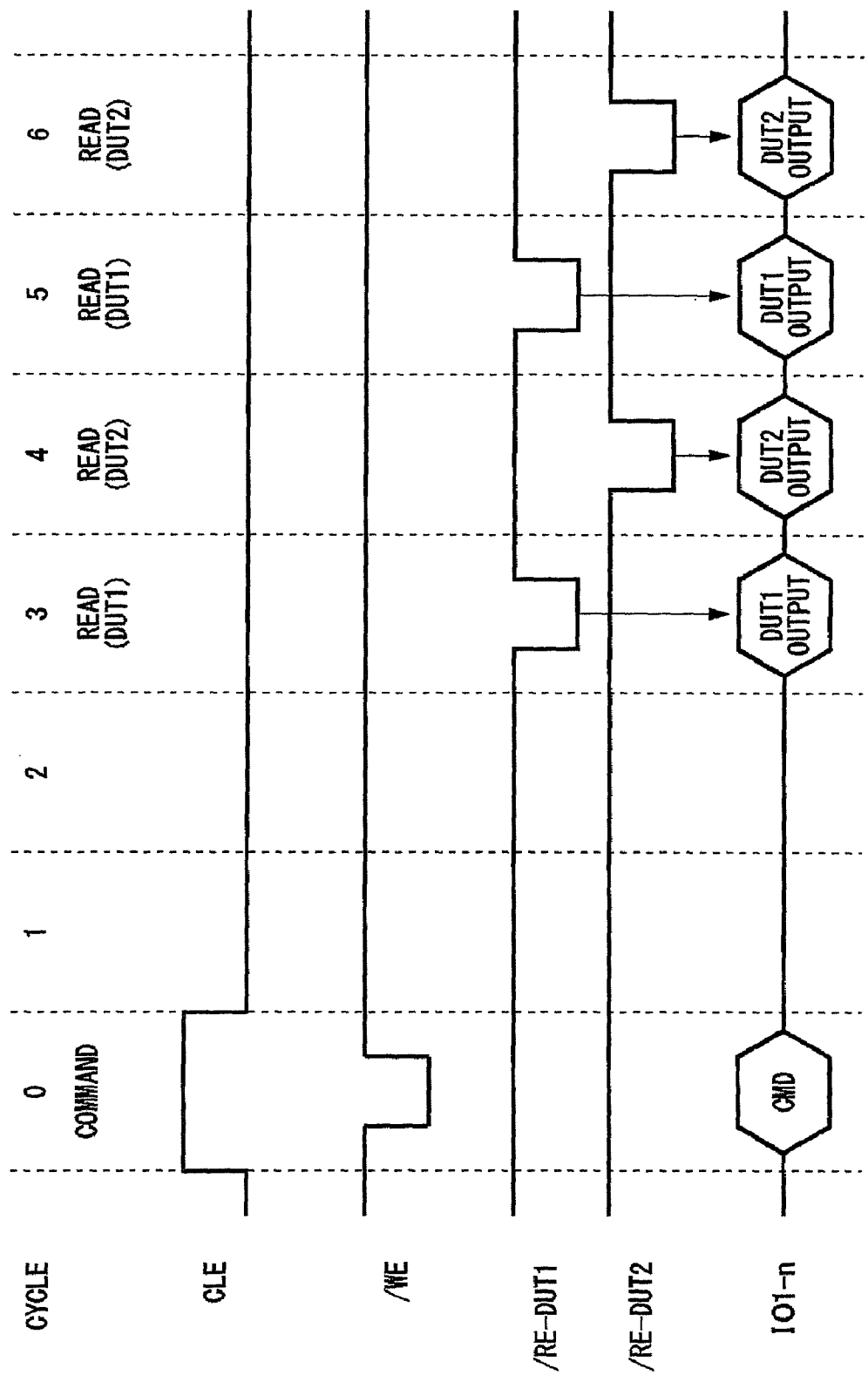
FIG. 5 is a timing chart of a process to read test data from memories under test 100-1-100-2.

FIG. 5 is a timing chart of a process to read test data from the memories under test 100-1-100-2. At Cycle 0, the command supplying section 136 supplies a read command to the memories under test 100-1-100-2, so as to read test data from the memories under test 100-1-100-2. At Cycle 3, the reading control section 138-1 supplies a read enable signal to the memory under test 100-1. The accordingly outputted test data from the memory under test 100-1 is received by the data supplying section 132. At Cycle 4, the reading control section 138-2 supplies a read enable signal to the memory under test 100-2. The accordingly outputted test data from the memory under test 100-2 is received by the data supplying section 132. In the similar manner, at Cycle 5, test data from the memory under test 100-1 is received, and at Cycle 6, test data from the memory under test 100-2 is received. Hereinafter, test data from the memory under test 100-1 and test data from the memory under test 100-2 are alternately received. The received test data is stored in a storage adequately selected by the selector 310 as stated above, so as to distinguish from which memory under test it has been outputted.

Figure 6:
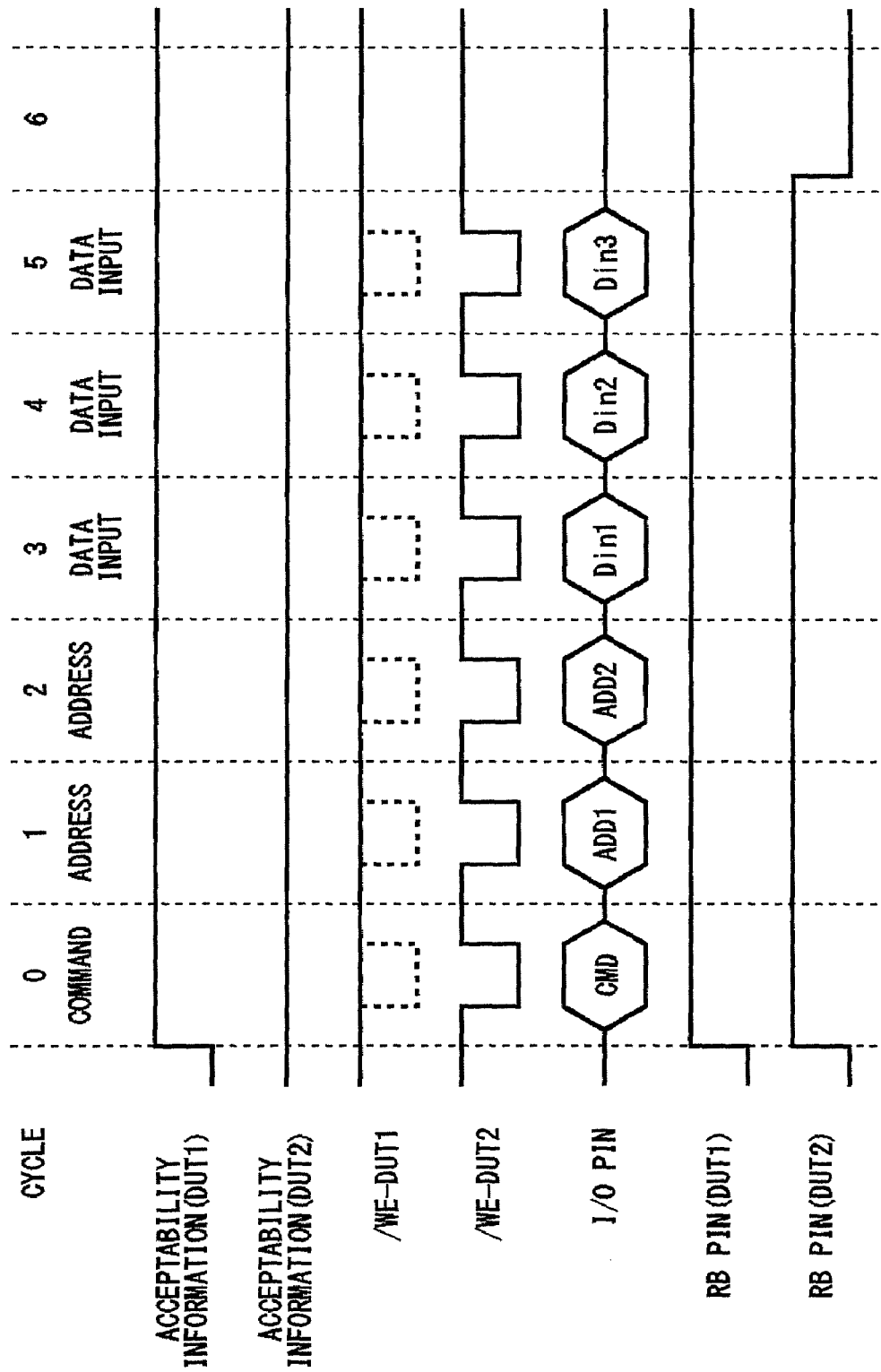
FIG. 6 shows a signal waveform in a case when writing to failure blocks is prohibited.

FIG. 6 shows a signal waveform in a case when writing to failure blocks is prohibited. When a failure is detected for a block of the memory under test 100-1, the logic value of the acceptability information corresponding to the particular block read from the failure block storage 355 is 1. In this case, the corresponding writing control section 135 does not output a write enable signal. The data supplying section 132 supplies the command at Cycle 0, supplies the address at Cycles 1 and 2, and supplies the data to the input/output terminal at Cycles 3-5, as in normal cases. However, since no write enable signal is supplied, the memory under test 100-1 does not store any data. Therefore, the signal for the RB pin is kept in the wait state (logic value 1). On the other hand, for the memory under test 100-2 for which no failure regarding the blocks is detected, the logic value of the acceptability information for a non-failure block read from the failure block storage 355 is 0. In this case, the corresponding writing control section 135 outputs a write enable signal. The data supplying section 132 successively supplies the command, the address, and the data to the input/output terminal, just as in the normal cases. Therefore, the memory under test 100-2 stores the data supplied from the data supplying section 132, according to the write enable signal.

In this way, the writing control sections 135-1-135-2 determine whether to perform writing, based on the acceptability information read from the failure block storage 355. Accordingly, further writing is stopped for a failure block upon detection of the failure.

As described above in relation to FIGS. 1-6, the test apparatus 10 according to the present embodiment is able to store test data received via a signal line common to a plurality of memories under test, by distinguishing from which memory under test the test data is read. Accordingly, an operation to analyze data after the test finishes is eliminated, thereby increasing the efficiency of the test. In addition, the test apparatus 10 according to the present embodiment prevents increase in the test time, by prohibiting further writing to a block to which a failure is detected. As a consequence, efficiency decrease for the entire test due to such an incidence that only a part of memories to be tested concurrently takes a long time will not happen.

Figure 7:
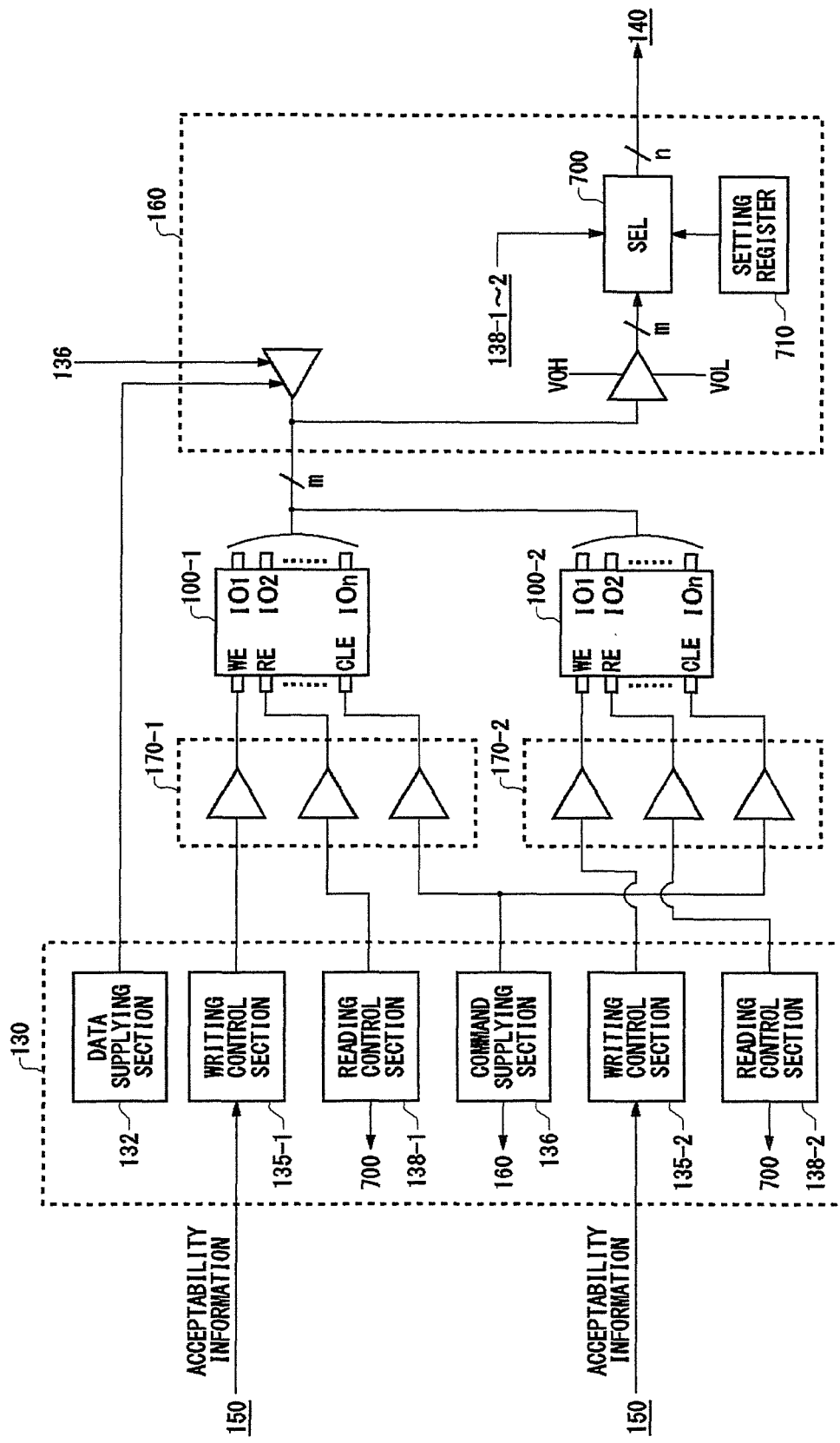
FIG. 7 shows peripheral circuits of memories under test 100-1-100-2, in a modification example of the present embodiment.

FIG. 7 shows peripheral circuits of the memories under test 100-1-100-2, in a modification example of the present embodiment. In the present modification example, signals outputted from memories under test can be associated with signals inputted to the sense controller 140 in a flexible manner, so as to allow tests of various kinds of memories which have differences therebetween, such as in the number of input/output pins, or the alignment of pins.

In the present modification example, the data input/output section 160 includes a connection selector 700 and a setting register 710, unlike the data input/output section 160 in FIG. 2. The setting register 710 sets which one of a plurality of test-apparatus-side input/output terminals (in this case, there are m test-apparatus-side input/output terminals) in the data input/output section 160, each of the memories under test 100-1-100-2 is connected to, according to the setting by an administrator or the like. According to the read enable signal received from the reading control sections 138-1-138-2, the connection selector 700 selects test-apparatus-side input/output terminals connected to the memory under test to which reading is to be performed, and supplies the signals received via the selected test-apparatus-side input/output terminals to the sense controller 140. In response to reception of the signals, the sense controller 140 compares, with the expected value data, the test data read via the test-apparatus-side input/output terminals set to be connected to the memory under test, for each of the memories under test 100-1-100-2. Accordingly, when any of the test data does not match the expected value data, acceptability information indicating failure of the corresponding memory under test can be outputted to the failure storage 150.

According to the present modification example, a test can be performed efficiently to memories under test having varied pin alignments, so as to allow wider application of the test apparatus.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

As clear from the foregoing, one embodiment of the present invention provides a test apparatus and a test method for concurrently testing a plurality of memories under test in an efficient manner.

What is claimed is:

1. A test apparatus for testing a plurality of memories under test, wherein each of the plurality of memories under test reads or writes data corresponding to one memory block, in response to a read command or a write command, the test apparatus comprises:

a failure block storage that stores, for each of the plurality of memories under test, acceptability information respectively of a plurality of memory blocks included in the memory under test;

a data input/output section that is bus connected to data input/output terminals respectively of the plurality of memories under test, and communicates data with the respective data input/output terminals;

a data supplying section that concurrently supplies test data to the plurality of memories under test via the data input/output section; and a writing control section that concurrently writes the test data to the plurality of memories under test, by concurrently supplying write enable signals to the plurality of memories under test in synchronization with the supply of the test data, and the writing control section, a) when concurrently writing the test data to the plurality of memories under test, reads acceptability information of a memory block corresponding to a writing address, from each of the plurality of failure block storages, and b) when the acceptability information read from the failure block storage indicates that the memory block corresponding to the writing address is a failure, masks the write enable signal to a corresponding memory under test, thereby prohibiting writing to the memory under test.

2. A test method of testing a plurality of memories under test that perform reading or writing of data corresponding to one memory block in response to a read command or a write command, the test method comprising:

for each of the plurality of memories under test, storing acceptability information respectively of a plurality of memory blocks included in the memory under test;

reading acceptability information of a memory block corresponding to a writing address;

when the read acceptability information indicates that the writing address is a failure, prohibiting writing to a corresponding memory under test; and by concurrently supplying test data to the plurality of memories under test, concurrently writing the test data to a part of the plurality of memories under test to which writing is not prohibited.

* * * * *